United States Patent
Boesch et al.

[11] Patent Number: 6,072,995
[45] Date of Patent: Jun. 6, 2000

[54] FLEXIBLE CURRENT CONTROL IN POWER AMPLIFIERS

[75] Inventors: Ronald D. Boesch, Morrisville; John W. Northcutt, Chapel Hill., both of N.C.

[73] Assignee: Ericsson Inc., Research Triangle Park, N.C.

[21] Appl. No.: 08/806,919

[22] Filed: Feb. 26, 1997

[51] Int. Cl.[7] ..................................... H04B 1/04
[52] U.S. Cl. ..................... 455/127; 455/553; 455/572; 330/288
[58] Field of Search ................... 455/127, 117, 455/115, 575, 571, 572, 552, 553; 330/297, 288; 375/297, 312

[56] References Cited

U.S. PATENT DOCUMENTS

| | | |
|---|---|---|
| 3,684,940 | 8/1972 | Lutz . |
| 4,045,746 | 8/1977 | Wheatley ............................ 330/288 |
| 4,924,191 | 5/1990 | Erb et al. . |
| 4,939,786 | 7/1990 | McCallum et al. .................. 455/127 |
| 5,287,555 | 2/1994 | Wilson et al. ...................... 455/115 |
| 5,423,078 | 6/1995 | Epperson et al. . |
| 5,432,473 | 7/1995 | Matilla et al. . |
| 5,546,051 | 8/1996 | Koizumi et al. .................... 330/297 |

FOREIGN PATENT DOCUMENTS

| | | |
|---|---|---|
| 0 359 477 | 3/1990 | European Pat. Off. . |
| 0 601 410 | 6/1994 | European Pat. Off. . |

*Primary Examiner*—Lee Nguyen
*Attorney, Agent, or Firm*—Jenkens & Gilchrist

[57] ABSTRACT

An amplifier circuit in a wireless telecommunications device includes a digital-to-analog converter (DAC) and a mirror circuit to deliver variable current levels to transmission circuitry. The DAC receives a digital signal indicating the desired current strength under the particular device circumstances and requirements, and an analog signal corresponding thereto is forwarded to the mirror circuit, which amplifies the analog signal to the desired level for driving the transmission circuitry.

10 Claims, 2 Drawing Sheets

FLEXIBLE CURRENT CONTROL IN POWER AMPLIFIERS

BACKGROUND OF INVENTION

1. Field of the Invention

The present invention relates generally to an improvement in amplifier circuitry, particularly, to improved amplifier circuitry for telecommunications systems, and, more particularly, to circuitry for flexibly controlling idle current in power amplifiers within mobile or other battery-powered telephones, such as cordless or cellular phones.

2. Background and Objects of the Present Invention

The evolution of wireless communication over the past century, since Guglielmo Marconi's invention of wireless telegraphy in 1895 and his demonstration in 1897 of radio's ability to provide continuous contact with ships sailing the English Channel, has been remarkable. Since Marconi's discovery, new wireline and wireless communication methods, services and standards have been adopted by people throughout the world. This evolution has been accelerating, particularly over the last ten years, during which time the mobile radio communications industry has grown by orders of magnitude, fueled by numerous technological advances that have made portable radio equipment smaller, cheaper and more reliable. One of these advances is the increasing use of digital technology in conjunction with or instead of analog.

Within every mobile phone is circuitry to set the DC current draw from the battery to the transmission circuitry. The proper current level is essential to transmit a phone call with sufficient strength and fidelity to overcome noise in the transmission channel.

Presently, telecommunications systems, such as the Digital Advanced Mobile Telephone Service (D-AMPS), operate in both analog and digital modes with circuitry switching between the two modes of communication. That circuitry alternates between two bias set points, i.e., quiescent or idle DC current settings, one for analog mode and another for digital mode. Since the idle current of the power amplifier significantly affects many amplifier and telephone parameters, e.g., talk time, adjacent channel power (digital mode) and heat, improvements in the regulation of such idle currents in D-AMPS and other systems will lead to more efficient telephone use.

Similarly, since there are presently many different telecommunication systems, each with their own standards and technological requirements, mobile phones combining two or more of these systems will require circuitry to govern the various different levels of idle current usage.

In D-AMPS systems at present, merely setting one quiescent current for analog mode and another for digital has resulted in several problems. First, when a mobile phone need not transmit at the maximum RF power, current is wasted, i.e., the predetermined and fixed maximum current level provides for RF performance far beyond the requirement at the lower transmit power level. As discussed hereinbefore, the current level was set to insure proper operation at the maximum RF power setting. This current waste is particularly apparent in dual function (analog and digital) phones, i.e., cordless or cellular, given the increased potential for varying power level requirements. In other words, a combination cordless/cellular phone would have a higher dynamic range of required RF power levels with differing required current levels.

Further, although the generic problem of decreasing power consumption as the output requirement falls is usually solved by using a Class C bias operation, this operation is only suitable for analog FM use and not digital applications where linearity is important, e.g., in $\pi/4$ Digital Quadrature Phase Shift Keying modulation systems.

Another problem encountered in setting the quiescent current levels high to handle all needs, including the use of maximum RF power, is yield problems in the production of the power amplifiers. This problem is apparently the result of the manufacturer not having total control of the saturated drain current, $I_{DSS}$. This would not be a problem for the high power case, but is a problem for the low power case with regard to transmit efficiency if $I_{DSS}$ increases. The high power case pulls more current under RF drive anyway, whereas the low power case would draw only the quiescent current which increases as $I_{DSS}$ increases.

Additionally, conventional power amplifiers now in use utilize a current mirror circuit, such as the one depicted in the figures of the instant application, to set the drain current in the amplifier stages. The current mirror circuit, however, is temperature dependent and sets less current when the amplifier is cold. At such lower temperatures, the amplifiers fail to sufficiently amplify the current and the circuit falls out of adjacent channel power specifications. Typically, this temperature-dependence problem is fixed by using an expensive thermistor or by setting the room temperature current at a higher level.

Although the aforedescribed temperature-dependence problem may be fixed, albeit at increased cost, by use of a thermistor, the other problems, i.e., current waste and yield, are not so easily solved and are instead typically tolerated.

It is accordingly, an object of the present invention to provide an adjustable amplifier circuit that provides variable current levels to drive transmission circuitry.

It is also an object of the present invention to reduce current waste in mobile or wireless telecommunications devices by flexibly adjusting the current level to the transmission needs.

It is an additional object of the present invention to provide a wireless telecommunications device incorporating an amplifier circuit that provides the proper current levels to transmission circuitry operating under various and different system requirements and in multimode use.

It is a further object of the present invention to provide an amplifier circuit that is less temperature-dependent.

SUMMARY OF THE INVENTION

The present invention is directed to an amplifier circuit in a wireless telecommunications device which includes a digital-to-analog converter (DAC) and a mirror circuit to deliver variable current levels to transmission circuitry. The DAC receives a digital signal indicating the desired current strength under the particular device circumstances and requirements, and an analog signal corresponding thereto is forwarded to the mirror circuit, which amplifies the analog signal to the desired level for driving the transmission circuitry.

A more complete appreciation of the present invention and the scope thereof can be obtained from the accompanying drawings which are briefly summarized below, the following detailed description of the presently-preferred embodiments of the invention, and the appended claims.

DETAILED DESCRIPTION OF THE PRESENT INVENTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In an effort to understand the operation of the flexibly controlled power amplifier circuitry of the present invention, such as embodied in a Monolithic Integrated Circuit MMIC, it is useful to first describe a component part thereof, i.e., a power amplifier bias control circuit, also known as a current mirror circuit, within an MMIC power amplifier.

Figure 1:
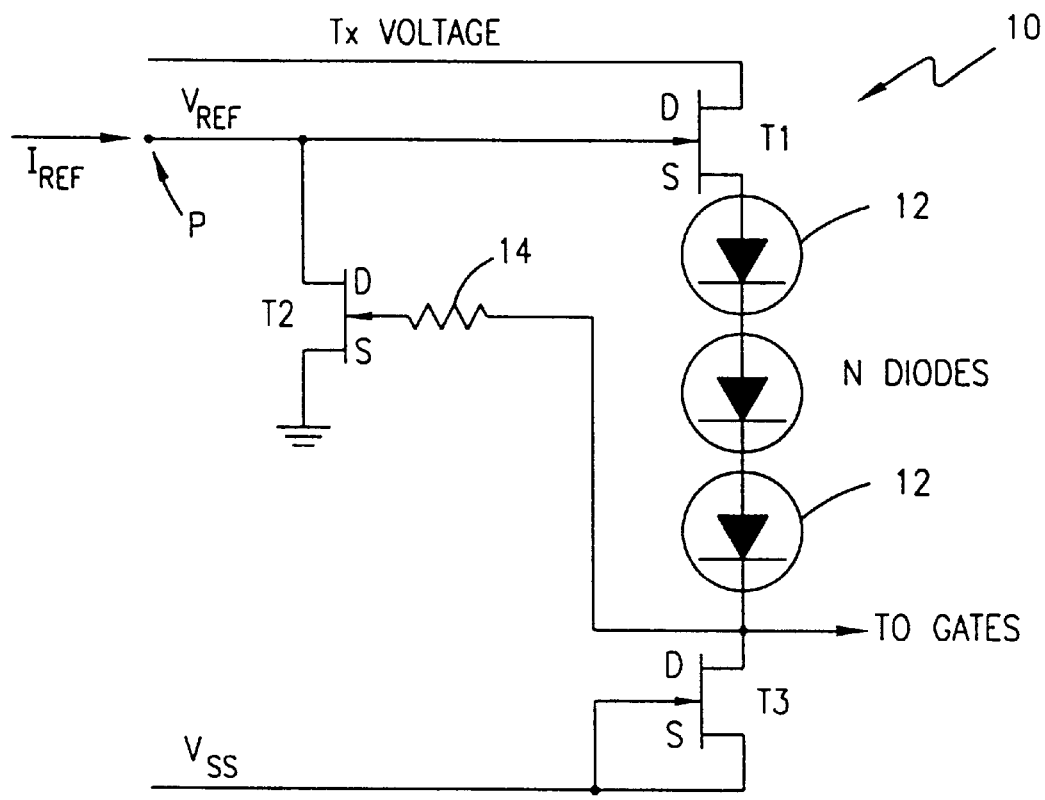
FIG. 1 is a schematic illustration of a conventional current mirror circuit, as used in a power amplifier.

With reference now to FIG. 1, there is illustrated a schematic representation of such a mirror circuit, indicated generally by reference numeral 10. Tx voltage is a regulated positive bias voltage generated from a battery (not shown) that is fed to all transmit functions (except the power Field Effect Transistors or FETs which run directly off the battery). Tx voltage is applied, inter alia, to the drain of a transistor T1. $V_{SS}$ is a negative voltage applied to the source and gate of a transistor T3.

As shown in FIG. 1, a reference current IREF is injected into another transistor T2 at a port P. A reference voltage $V_{REF}$ at port P (also referred to herein as the $V_{REF}$ port) is level shifted down through the transistor T1, through a series of level shifting diodes 12, and through a gate resistor 14, and impressed upon the gate of transistor T2. The level-shifted gate voltage at the gate of transistor T2 is the proper negative voltage needed to sustain the reference current $I_{REF}$. It should be understood that N represents the number of serial diodes 12 required for level shifting, which depends upon the available range for the $V_{REF}$ voltage.

Under normal operation, with Tx voltage present, the reference current, $I_{REF}$, is varied to provide variable current flow through transistor T2. As $I_{REF}$ increases, $V_{REF}$ increases slightly which (through the level shifting diodes 12) brings the gate voltage on transistor T2 closer to ground (the source voltage on T2). This voltage is consistent with an increased current through transistor T2. So, as $I_{REF}$ increases, the current through T2 increases. A scaled amount of the current flowing through transistor T2 is accordingly mirrored into the aforementioned power amplifier FETs through the action of the shared gate voltage and the relative sizes of the power transistors to the transistor T2.

Figure 2:
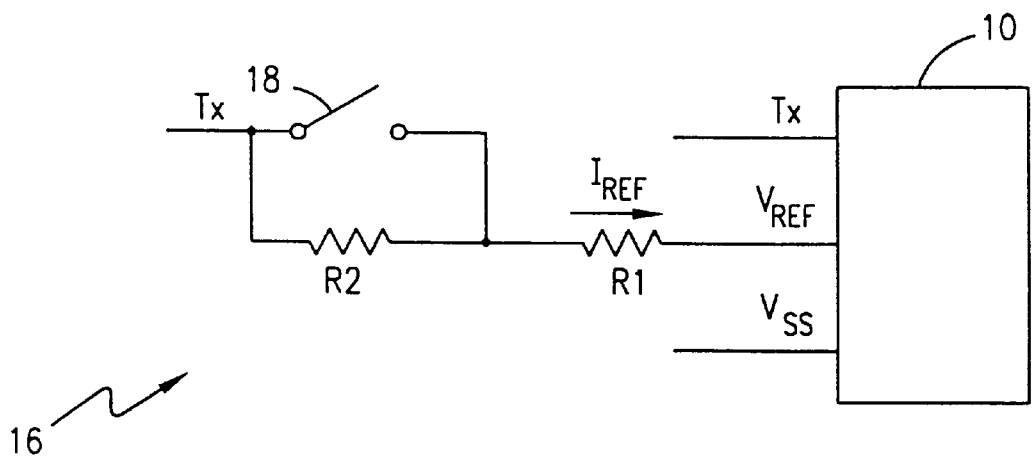
FIG. 2 is a schematic illustration of a conventional power amplifier circuit arrangement for controlling the level of current flowing to the mirror circuit of FIG. 1, and employing a switch to switch between analog and digital modes.

Shown in FIG. 2 is a dual-mode power amplifier or MMIC, indicated generally by reference numeral 16, which contains a switch 18. The mirror circuit 10 (power amplifier bias control circuit) is as shown in and as described in connection with FIG. 1. Through use of the switch 18, the amount of current (and voltage) leading to the $V_{REF}$ port of mirror circuit 10 due to the Tx voltage can be adjusted for the two modes of operation.

For example, for analog mode switch 18 is opened, and the aforedescribed reference current, $I_{REF}$, is restricted through both resistors R1 and R2 to the $V_{REF}$ port of the mirror circuit 10, as shown in FIG. 2. In digital mode, however, switch 18 is closed, thereby shorting out resistor R2 and forcing $I_{REF}$ to a higher current. For example, in a dual mode phone, such as in D-AMPS, current flow in analog mode, i.e., switch 18 open, is about 100 mA, whereas in digital mode, i.e., switch 18 closed, current flow increases to about 180 mA.

In this manner, switch 18 switches between two different current settings, varying the amount of current (and voltage) supplied to the mirror circuit 10 (and subsequent transmission circuitry described hereinafter) in accordance with the particular requirements in the transmission circuitry. Accordingly, different quiescent currents for analog and digital modes may be set to avoid use of excess (and wasteful) current. As discussed in the above example, the switch 18 reduces the current from 180 mA (digital mode) to 100 mA (analog mode) in accordance with the particular transmission power level requirement for that mode. In digital mode, at the same RF power as analog mode, the phone must provide more linear power which requires the increase in the bias current.

As noted, whenever less than the maximum RF power is required for transmission, having fixed current levels for all transmissions in a given mode wastes current. For example, a cellular phone need not utilize the maximum current available to power the transmission circuitry when a smaller current based on achieving just enough margin over specification is available. For example, when digital mode linear RF power is being transmitted, the spectral mask or adjacent channel power can be achieved with much lower current when the transmitter provides −4 dBm output power versus +28 dBm output power. Excess margin is wasteful and the avoidance of which is a subject of the present patent application. Thus, there is a need for flexibly adjusting the amount of current in power amplifiers which drive the transmission circuitry.

As also noted, the mirror circuit 10 within the power amplifier 16 is temperature sensitive. Consequently, when the amplifier 16 becomes cold, the mirror circuit 10 becomes cold and the quiescent current or $V_{REF}$ is set at a lower level, resulting in transmission problems such as meeting the adjacent channel power specification. One solution is to set the quiescent current to a higher value, which would be wasteful when operating at normal room temperature. Another solution is to utilize a thermistor (not shown), e.g., in the resistor R1's position in FIG. 2, to maintain $V_{REF}$ levels under low temperatures. As noted, the addition of a thermistor to the amplifier 16 circuitry increases costs.

With reference again to the configuration shown in FIG. 2, the aforementioned scheme having two separate current or bias levels, one for analog and another for digital, has only two modes or levels, and a single switch 18 to switch between the modes. If lower bias levels are desired for other lower RF power requirements, the natural extension of this concept is to use more switches, i.e., transistors configured as switches, along with some control logic to generate the appropriate $I_{REF}$ for a desired bias current level. This is a nonoptimal solution as it increases cost, component count and circuit board area.

Figure 3:
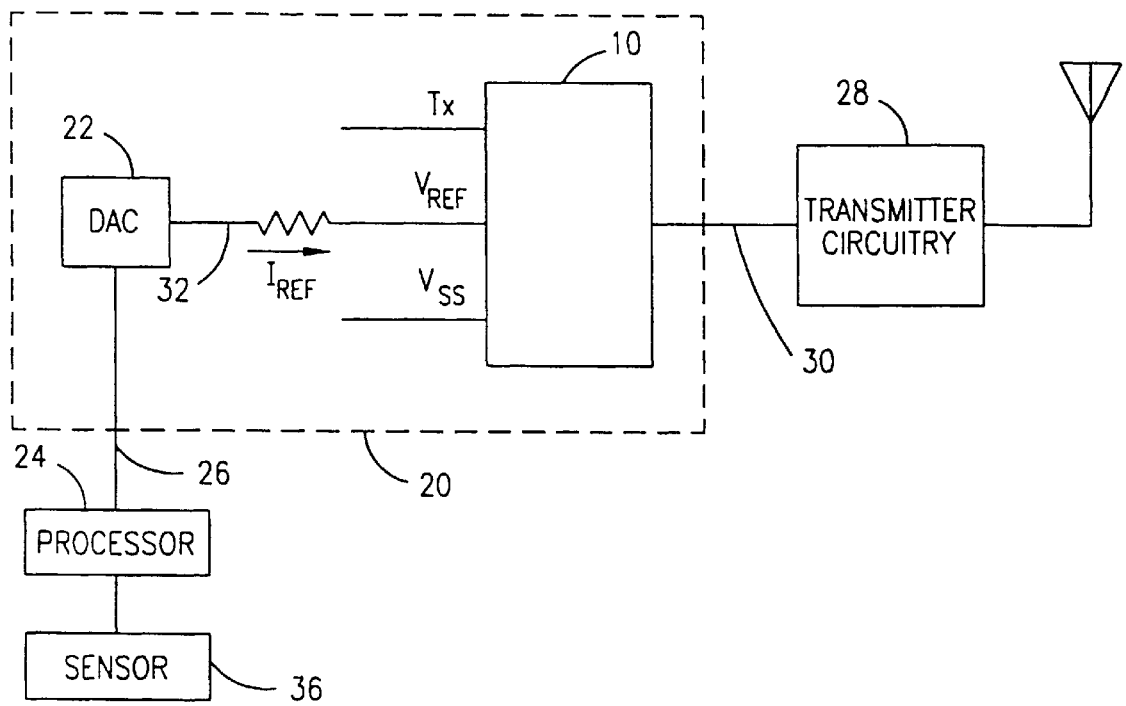
FIG. 3 is a schematic illustration of a portion of a mobile telecommunications device which includes a first embodiment of the improved power amplifier circuit arrangement of the present invention, which flexibly controls the levels of current flowing to the mirror circuit and transmission circuitry through use of a digital to analog converter.

Referring now to FIG. 3, a schematic illustration of a flexibly controlled power amplifier circuit according to the present invention is shown and indicated generally by the reference numeral 20. Instead of switches, as used in the conventional amplifier 16 circuitry shown in FIG. 2, to control the current levels to the mirror circuit 10 (and transmission circuitry), the circuit 20 shown in FIG. 3 employs a digital-to-analog conversion (DAC) circuit 22 to govern current flow. It should be understood that the DAC 22 is preferably a conventional, commercially-available digital-to-analog circuit which receives a plurality of digital input signals, such as from a processor 24 across a line 26, and forwards an analog signal corresponding to the particular pattern of digital input signals to transmission circuitry 28 across another line 30, as illustrated in FIG. 3. This DAC could be a stand alone Integrated Circuit (IC) or incorporated inside another IC as a subblock, as is understood in the art.

Figure 4:
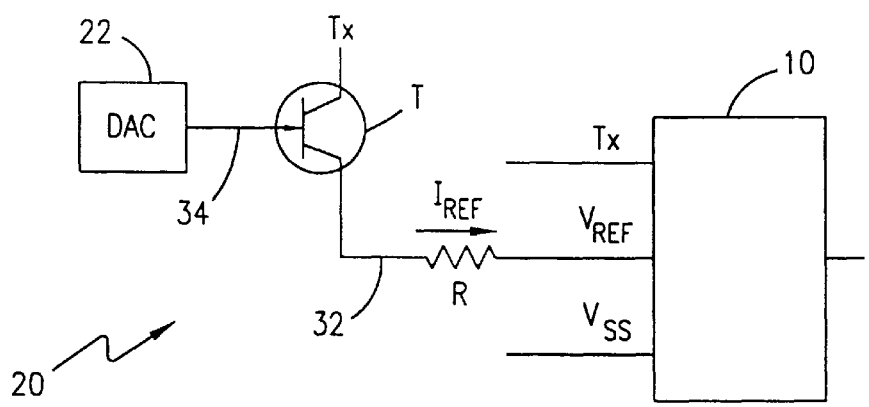
FIG. 4 is a schematic illustration of an alternate embodiment of the power amplifier circuit shown in FIG. 3.

In response to a digital signal from the processor 24, which is resident within a cellular phone or other such portable telecommunications device, the DAC 22 determines the appropriate analog signal corresponding to the digital directive, and forwards that signal across a line 32 to the mirror circuit 10. A resistor R along line 32 translates the voltage signal from the DAC into an $I_{REF}$ current. It should be understood that the range of the $I_{REF}$ current to the $V_{REF}$ port of the mirror circuit 10 in this embodiment will be limited by the output current of the DAC 22 itself. To boost the current range, a transistor T or other amplification means may be added, as shown in FIG. 4. The DAC 22 in the amplifier circuitry of FIG. 4 forwards the converted analog signal across a line 34 to the base of transistor T. The Tx voltage is applied to the collector of transistor T, the emitter of which is attached to line 32. Accordingly, when the DAC analog signal is applied to the base of transistor T, the higher current through the emitter follower is sourced to the $V_{REF}$ port of the mirror circuit 10, boosting the current thereto.

It should be understood that since the ambient temperature of the cellular phone (or other portable device) utilizing the amplifier circuit 20 of the present invention, as well as other operational information, may be forwarded to processor 24 from a plurality of sensors, such as a sensor 36 shown in FIG. 3, the DAC 22 may forward increased voltage to compensate for low temperatures or other conditions. Accordingly, no additional thermistors are required to fix the temperature dependence of the mirror circuit 10.

It should also be understood that a multiplicity of current settings may be programmed based upon the characterization of the power amplifier MMICs. In this manner, just the right amount of current for a given transmission power level is forwarded to the transmission circuitry 28 to achieve just enough margin over the appropriate equipment specifications, with no current wasted on excess margin. Indeed, the circuitry of the present invention provides for an arbitrary number of current settings, i.e., it is a function of the size of the DAC 22, with each setting determined solely by the voltage range of the DAC 22, the increased current range due to the addition of a transistor T, the temperature or some other controlling parameter.

It should further be understood that the circuitry for flexible amplifier current control set forth in the instant application is useful for any portable wireless telecommunication device controlled by a battery, particularly those wireless devices requiring two or more current settings or levels to control transmission signal bias and prevent current waste. In particular, the subject matter of the present invention is useful in multiband or multimode phones, i.e., phones having many different and dispersed transmission capabilities, with each of said bands or modes having different current level requirements (to drive the transmission circuitry 28). In this manner, any combination of different telecommunications standards may be available to a mobile phone incorporating the advantages of the present invention, e.g., Code-Division Multiple Access, Time-Division Multiple Access, Global System for Mobile Communications, Advanced Mobile Phone System, Digital European Cordless Telecommunications (DECT), cordless and other systems. It should be understood, however, that the advantages and benefits of the present invention are also useful in single band (or mode) phones such as in D-AMPS.

It should additionally be understood that the advantages and benefits of the circuitry arrangement set forth in the present patent application are simple to implement and cost effective. The processor 24 would have to be programmed to send the proper digital signals to the off-the-shelf DAC 22. It should, of course, be understood that the functions of the DAC 22 may be subsumed by the processor 24 or a separate processor (not shown) may be employed to coordinate the digital-to-analog conversion in accordance to the various inputs, such as from sensor 36.

The previous description is of preferred embodiments for implementing the invention, and the scope of the invention should not necessarily be limited by this description. The scope of the present invention is instead defined by the following claims.

What is claimed is:

1. In a wireless communications system having a plurality of portable devices in communication therewith, said portable devices including a transmitter circuit therein, circuitry within a given one of said portable devices for adjustably controlling current levels to said transmitter circuit therein, said circuitry comprising:

a digital-to-analog converter for converting a digital input signal to an analog signal corresponding thereto, said converter producing a multiplicity of discrete analog signals adjustably controlled by said digital input signal;

a mirror circuit, connected to said converter, for receiving said discrete analog signals therefrom and forwarding an adjusted analog signal to said transmitter circuit; and a transistor between said converter and mirror circuit connection, the base of said transistor being connected to said converter, the emitter of said transistor being connected to said mirror circuit, and the collector of said transistor being connected to a voltage source.

2. The wireless communication system according to claim 1, further comprising a resistor between said transistor and mirror circuit connection.

3. The wireless communication system according to claim 1, wherein said given portable device operates in an analog and a digital mode, said transmitter circuit transmitting at a first power level when said portable device is in said analog mode and at a second power level when said portable device is in said digital mode.

4. The wireless communication system according to claim 1, wherein said given portable device is a cordless device.

5. The wireless communication system according to claim 1, wherein said given portable device is a cellular phone.

6. The wireless communication system according to claim 1, wherein said given portable device is in a particular one of a multiplicity of discrete modes, said converter producing a particular analog signal corresponding to said particular mode, said mirror circuit receiving said particular analog signal and forwarding a particular adjusted analog signal to said transmitter circuit, said transmitter circuit transmitting a signal at a particular power level, said particular power level being determined by said particular mode of said given portable device.

7. The wireless communication system according to claim 1, wherein said transmitter circuit transmits at a multiplicity of discrete power levels, a given one of said multiplicity of discrete power levels being a maximum power level, a plurality of other ones of said multiplicity of discrete power levels being less than said maximum power level.

8. The wireless communication system according to claim 1, further comprising:

a processor, connected to said digital-to-analog converter, for producing said digital input signal and forwarding said digital input signal to said converter, said analog signal being one of said multiplicity of discrete analog signals, and said analog signal being determined by said digital input signal from said processor.

9. The wireless communication system according to claim 8, wherein said digital-to-analog converter is part of said processor.

10. The wireless communication system according to claim 8, further comprising:

a sensor connected to said processor, said processor configured to adjust the value of said digital input signal in response to said sensor.

* * * * *